United States Patent
Yin et al.

(10) Patent No.: US 12,374,524 B2
(45) Date of Patent: *Jul. 29, 2025

(54) IN-LENS WAFER PE-CHARGING AND INSPECTION WITH MULTIPLE BEAMS

(71) Applicant: ASML NETHERLANDS B.V., Veldhoven (NL)

(72) Inventors: Weihua Yin, Santa Clara, CA (US); Youfei Jiang, Milpitas, CA (US)

(73) Assignee: ASML Netherlands B.V., Veldhoven (NL)

( * ) Notice: Subject to any disclaimer, the term of this patent is extended or adjusted under 35 U.S.C. 154(b) by 756 days.

This patent is subject to a terminal disclaimer.

(21) Appl. No.: 17/494,518

(22) Filed: Oct. 5, 2021

(65) Prior Publication Data
US 2022/0102111 A1    Mar. 31, 2022

Related U.S. Application Data

(63) Continuation of application No. 16/729,177, filed on Dec. 27, 2019, now Pat. No. 11,152,191.
(Continued)

(51) Int. Cl.
*H01J 37/26*    (2006.01)
*H01J 37/12*    (2006.01)
*H01J 37/147*   (2006.01)

(52) U.S. Cl.
CPC ............ *H01J 37/265* (2013.01); *H01J 37/12* (2013.01); *H01J 37/1472* (2013.01)

(58) Field of Classification Search
CPC ....... H01J 37/12; H01J 37/265; H01J 37/1472
See application file for complete search history.

(56) References Cited

U.S. PATENT DOCUMENTS

| | | |
|---|---|---|
| 4,417,203 A | 11/1983 | Pfeiffer et al. |
| 6,091,249 A | 7/2000 | Talbot et al. |

(Continued)

FOREIGN PATENT DOCUMENTS

| | | |
|---|---|---|
| JP | H08195345 A | 7/1996 |
| JP | H10313027 A | 11/1998 |

(Continued)

OTHER PUBLICATIONS

Notification of Reasons(s) for Refusal issued by the Korean Patent Office in related Korean Patent Application No. 10-2021-7019271; mailed Jul. 27, 2023 (13 pgs.).

(Continued)

*Primary Examiner* — Sean M Luck
(74) *Attorney, Agent, or Firm* — FINNEGAN, HENDERSON, FARABOW, GARRETT & DUNNER, LLP.

(57) ABSTRACT

A charged particle system may include a first charged particle beam source provided on a first axis, and a second charged particle beam source provided on a second axis. There may also be provided a deflector arranged on the first axis. The deflector may be configured to deflect a beam generated from the second charged particle beam source toward a sample. A method of operating a charged particle beam system may include switching between a first state and a second state of operating a deflector. In the first state, a first charged particle beam generated from a first charged particle beam source may be blanked and a second charged particle beam generated from a second charged particle beam source may be directed toward a sample. In the second state, the second charged particle beam may be blanked and the first charged particle beam may be directed toward the sample.

16 Claims, 5 Drawing Sheets

Related U.S. Application Data

(60) Provisional application No. 62/787,128, filed on Dec. 31, 2018.

(56) References Cited

U.S. PATENT DOCUMENTS

| | | |
|---|---|---|
| 6,232,787 B1 | 5/2001 | Lo et al. |
| 6,252,412 B1 | 6/2001 | Talbot et al. |
| 6,344,750 B1 | 2/2002 | Lo et al. |
| 6,586,733 B1 | 7/2003 | Veneklasen et al. |
| 7,205,542 B1 | 4/2007 | Mankos et al. |
| 7,560,939 B1 | 7/2009 | De et al. |
| 8,258,474 B1 | 9/2012 | Mankos |
| 8,283,641 B2 | 10/2012 | Donitz et al. |
| 8,759,762 B2 | 6/2014 | Xiao et al. |
| 9,691,586 B2 | 6/2017 | Ren et al. |
| 2004/0085024 A1 | 5/2004 | Aviel et al. |
| 2007/0200069 A1 | 8/2007 | Frosien et al. |
| 2009/0166557 A1 | 7/2009 | Makino et al. |
| 2009/0212213 A1 | 8/2009 | Nakasuji et al. |
| 2009/0218506 A1 | 9/2009 | Nakasuji et al. |
| 2009/0289195 A1* | 11/2009 | Henstra ............ H01J 37/063 250/396 R |
| 2009/0321634 A1 | 12/2009 | Khursheed |
| 2010/0133433 A1 | 6/2010 | Tanimoto et al. |
| 2013/0075623 A1 | 3/2013 | Cheng et al. |
| 2014/0107959 A1 | 4/2014 | Kimba et al. |
| 2015/0279615 A1 | 10/2015 | Potocek et al. |
| 2016/0035537 A1 | 2/2016 | Erel et al. |
| 2017/0025243 A1 | 1/2017 | Ren et al. |
| 2017/0092459 A1 | 3/2017 | Takahashi et al. |
| 2017/0263413 A1 | 9/2017 | Frosien |

FOREIGN PATENT DOCUMENTS

| | | |
|---|---|---|
| JP | 2006234789 A | 9/2006 |
| TW | 201618151 A | 5/2016 |
| TW | 1597757 B | 9/2017 |
| WO | WO 2018/122176 A1 | 7/2018 |

OTHER PUBLICATIONS

International Search Repot issued in related Foreign Application No. PCT/EP2019/082179; mailed Apr. 2, 2020 (5 pgs.).

Office Action issued by the Chinese Intellectual Property Office (IPO) in related Application No. 108144443, mailed Sep. 3, 2020 (11 pgs.).

Notice of Reasons for Rejection from the Japan Patent Office issued in related Japanese Patent Application No. 2021-531898; mailed Jun. 28, 2022 (9 pgs.).

Notice of Reasons for Rejection issued by the Japan Patent Office in related Japanese Patent Application No. 2021- 531898; mailed Oct. 7, 2022 (9 pgs.).

Notification of Reason(s) for Refusal issued in related Korean Patent Application No. 10-2020-7019271; mailed Feb. 13, 2023 (10 pgs.).

* cited by examiner

IN-LENS WAFER PE-CHARGING AND INSPECTION WITH MULTIPLE BEAMS

CROSS-REFERENCE TO RELATED APPLICATIONS

This application is a continuation of U.S. application Ser. No. 16/729,177, filed Dec. 27, 2019, which claims priority of U.S. Application No. 62/787,128 which was filed on Dec. 31, 2018, all of which are incorporated herein by reference in their entireties.

TECHNICAL FIELD

The embodiments provided herein relate to charged particle optical systems that may be applicable in a charged particle apparatus with one or more charged particle beams, such as an electron microscopy apparatus utilizing one or more electron beams.

BACKGROUND

In manufacturing processes for integrated circuits (ICs), circuit components may be inspected to ensure they are manufactured according to design and are free of defects. Pattern defects, uninvited particles (e.g., residuals), or the like may appear on a wafer or a mask during fabrication and may thereby reduce yield. For example, uninvited particles may be troublesome for patterns with smaller critical feature dimensions, which may have been adopted to meet the more and more advanced performance requirements of IC chips.

A charged particle (e.g., electron) beam microscope, such as a scanning electron microscope (SEM) or a transmission electron microscope (TEM), capable of resolution down to less than a nanometer, may serve as a practical tool for inspecting IC components having feature sizes down to, for example, the sub-100 nanometer scale. In a SEM tool, a beam of primary electrons having a relatively high energy may be decelerated to land on a sample at a relatively low landing energy and focused to form a probe spot thereon. Due to incidence of primary electrons on the sample at the focused probe spot, secondary electrons may be generated from the surface. By scanning the probe spot over the sample surface and collecting secondary electrons, inspection tools may obtain an image of the sample surface.

In some applications, physical and electrical defects on a sample may be detected using a voltage contrast method of a charged particle beam inspection system. But improvements are needed with these conventional systems.

SUMMARY

Embodiments of the present disclosure may provide a charged particle optical system that may include a first charged particle beam source provided on a first axis, and a second charged particle beam source that may be provided on a second axis. There may also be provided a component arranged on the first axis configured to deflect a beam generated from the second charged particle beam source toward a sample. The first charged particle beam source may be a primary electron beam source of a scanning electron microscope. The component may include a deflector, an electrostatic lens, a magnetic lens, a Wein filter, or the like.

There may also be provided a method of operating a charged particle beam system. The method may include switching between a first state and a second state of operating a component. The component may be configured to generate a magnetic field or an electric field. In the first state, a first charged particle beam generated from a first charged particle beam source may be blanked and a second charged particle beam generated from a second charged particle beam source may be directed toward a sample. In the second state, the second charged particle beam may be blanked and the first charged particle beam may be directed toward the sample. The first state may correspond to a pre-charging operation and the second state may correspond to an imaging operation.

According to some embodiments, switching between pre-charging and imaging may be made faster and more efficient. Furthermore, system design flexibility may be enhanced.

Additional objects and advantages of the disclosed embodiments will be set forth in part in the following description, and in part will be apparent from the description, or may be learned by practice of the embodiments. Objects and advantages of the disclosed embodiments may be realized and attained by the elements and combinations set forth in the disclosure. However, exemplary embodiments of the present disclosure are not necessarily required to achieve such exemplary objects and advantages, and some embodiments may not achieve any of the stated objects and advantages.

It is to be understood that both the foregoing general description and the following detailed description are exemplary and explanatory only and are not restrictive of the disclosed embodiments.

BRIEF DESCRIPTION OF DRAWINGS

The above and other aspects of the present disclosure will become more apparent from the description of exemplary embodiments, taken in conjunction with the accompanying drawings in which.

DETAILED DESCRIPTION

Figure 1:
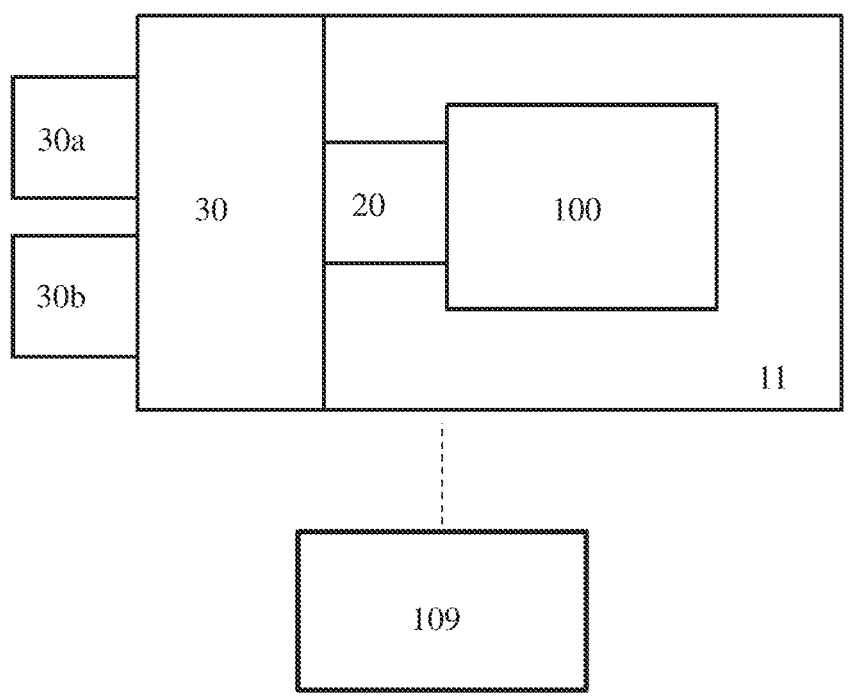
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems, apparatuses, and methods consistent with aspects related to the invention as recited in the appended claims. Relative dimensions of components in drawings may be exaggerated for clarity.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which may be the size of a thumbnail) may include over 2 billion transistors, the size of each transistor being less than 1/1000th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

It is increasingly important to ensure the ability to detect defects with high accuracy and high resolution while maintaining high throughput (defined as the number of wafers processed per hour, for example). High process yields and high wafer throughput may be impacted by the presence of defects, especially when operator intervention is involved. Thus, detection and identification of micro and nano-sized defects by inspection tools (such as a SEM) is important for maintaining high yields and low cost.

As stated above, in some applications, physical and electrical defects on a sample may be detected using a voltage contrast method of a charged particle beam inspection system. To detect voltage contrast defects, typically a process called pre-charging is employed in which charged particles are applied onto an area to be inspected before conducting the inspection. Benefits of pre-charging may include, among others: 1) the ability to supply sufficient charged particles to a wafer to generate a voltage on features of the wafer sufficient to cause defective and surrounding non-defective features to behave differently under inspection (e.g., voltage contrast inspection); and 2) enhancing the voltage contrast signal of defects so that a satisfactory signal-to-noise ratio (SNR) can be obtained and defects may be easily detected in a charged particle inspection system.

In conventional systems, pre-charging may be accomplished by scanning the primary beam of a charged particle inspection tool over the sample surface before using the primary beam for inspection. Alternatively, a separate charged particle source may be used to pre-charge a wafer surface and set the charging conditions. A separate charged particle source, such as a dedicated e-beam flood gun, may be used to enhance the voltage contrast defect signal, so as to increase the defect detection sensitivity or throughput. In a flooding procedure, a flood gun may be used to provide a relatively large amount of electrons to charge a predefined area. Afterwards, the primary electron source of an e-beam inspection system may be applied to scan an area within the pre-charged area to achieve imaging of the area.

However, current pre-charging techniques may face some of the following limitations. First, there may be a critical charging decay time in some applications. For example, accumulated charge on a sample surface may decay relatively quickly, and thus some applications may require fast switching from pre-charging to inspection. This may impose constraints on systems and methods for inspection. Additionally, some current techniques may involve physically moving a stage that supports a sample, which is time consuming and introduces sources of error.

Second, throughput may be limited. For example, certain applications, such as 3D NAND may require pre-charging on a per-strip basis. Frequent switching between pre-charging and inspection scanning may be required. The time and expense associated with switching events may have negative impact on process throughput.

Third, when a dedicated flood gun is provided, its performance may be limited by cost restraints, by virtue of being a sub-component subordinate to other sub-systems in a charged particle inspection system, or by virtue of the delay caused due to the sample having to be physically moved to be in the beam path of the flood gun. Further, traditional flood guns may have much more simplified controls compared to, for example, a SEM's primary beam source. Accordingly, a flood gun may have limited controllability and low accuracy. Additionally, attempting to address such limitations by making improvements to the dedicated flood gun to have more precise controllability may be impractically expensive. Moreover, packaging constraints may restrict the amount of modification that is possible to a dedicated flood gun occupying a space in a charged particle beam inspection system.

Fourth, when the primary beam of an inspection system is used for pre-charging, primary beam flooding may cause aperture contamination. The primary beam of an inspection system may be configured to expose an aperture to large amounts of electrons, and the aperture may be easily contaminated.

To summarize these conventional inspection tools, pre-charging of a sample may be used to deposit electrical charge on the sample surface prior to conducting imaging. In some applications, accumulated charge on a sample may decay very quickly. Therefore, it may be necessary to switch back and forth between pre-charging and imaging processes in order to maintain an appropriate level of charge on the sample to continue to conduct imaging. However, switching between pre-charging and imaging may involve numerous complications. For example, as discussed above, switching may be too time consuming, detrimental to throughput, difficult to control, and may lead to aperture contamination. Therefore, improved systems and methods are desired that may be helpful for conducting pre-charging and imaging.

The present disclosure provides, among others, systems and methods for charged particle imaging. In some embodiments, a separate, dedicated second charged particle beam source is provided in addition to a primary charged particle beam source. The primary and second charged particle beam sources may be configured to share a single objective lens. The second charged particle beam source may be arranged at a particular angle or range of angles so that it may generate a beam whose trajectory can be adjusted by way of an alignment deflector, such as a Wein filter. Furthermore, the alignment deflector may be configured to operate in a first operating state and a second operating state, wherein changing between the first operating state and the second operating state involves adjusting a voltage applied to the alignment deflector. Therefore, switching between a first state of a charged particle beam system, in which pre-charging may be performed, and a second state, in which imaging may be performed, may be made faster.

Without limiting the scope of the present disclosure, descriptions and drawings of embodiments may be exemplarily referred to as using an electron beam. However, the embodiments are not used to limit the present invention to specific charged particles. For example, systems and methods for beam forming may be applied to photons, x-rays, and ions, etc. Furthermore, the term "beam" may refer to primary electron beams, primary electron beamlets, secondary electron beams, or secondary electron beamlets, among others.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C.

Embodiments of the present disclosure may attain numerous other advantageous, which shall be discussed below.

Reference is now made to FIG. 1, which illustrates an exemplary electron beam inspection (EBI) system 10 that may include a detector, consistent with embodiments of the present disclosure. EBI system 10 may be used for imaging. As shown in FIG. 1, EBI system 10 includes a main chamber 11 a load/lock chamber 20, an electron beam tool 100, and an equipment front end module (EFEM) 30. Electron beam tool 100 is located within main chamber 11. EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples may be collectively referred to as "wafers" herein).

One or more robotic arms (not shown) in EFEM 30 may transport the wafers to load/lock chamber 20. Load/lock chamber 20 is connected to a load/lock vacuum pump system (not shown) which removes gas molecules in load/lock chamber 20 to reach a first pressure below the atmospheric pressure. After reaching the first pressure, one or more robotic arms (not shown) may transport the wafer from load/lock chamber 20 to main chamber 11. Main chamber 11 is connected to a main chamber vacuum pump system (not shown) which removes gas molecules in main chamber 11 to reach a second pressure below the first pressure. After reaching the second pressure, the wafer is subject to inspection by electron beam tool 100. Electron beam tool 100 may be a single-beam system or a multi-beam system. A controller 109 is electronically connected to electron beam tool 100, and may be electronically connected to other components as well. Controller 109 may be a computer configured to execute various controls of EBI system 10. While controller 109 is shown in FIG. 1 as being outside of the structure that includes main chamber 11, load/lock chamber 20, and EFEM 30, it is appreciated that controller 109 can part of the structure.

Figure 2A:
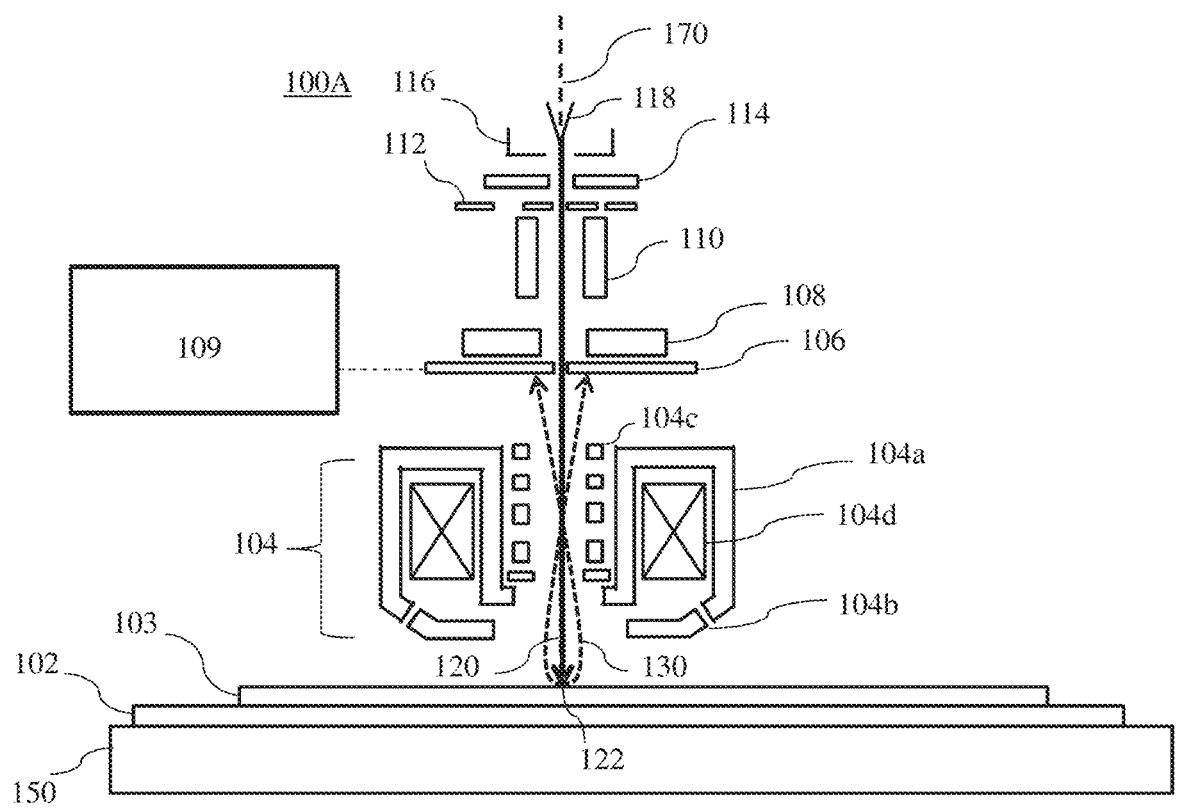
FIG. 2A and FIG. 2B illustrate exemplary electron beam tools that may be part of the electron beam inspection system of FIG. 1, consistent with embodiments of the present disclosure.

FIG. 2A is a schematic diagram illustrating an exemplary electron beam tool 100A that may be used in EBI system 10, consistent with the disclosed embodiments. As shown in FIG. 2A, electron beam tool 100A includes a motorized stage 150, and a wafer holder 102 supported by motorized stage 150 to hold a wafer 103 to be inspected. Electron beam tool 100A further includes a compound objective lens 104, electron detector 106, an objective aperture 108, a condenser lens 110, a beam limit aperture 112, a gun aperture 114, an anode 116, and a cathode 118, one or more of which may be aligned with an optical axis 170 of electron beam tool 100A.

Compound objective lens 104, in some embodiments, may include a modified swing objective retarding immersion lens (SORIL) that includes a pole piece 104a, a control electrode 104b, a deflector or a set of deflectors 104c, and an exciting coil 104d. Electron beam tool 100A may additionally include an energy dispersive X-ray spectrometer (EDS) detector (not shown) to characterize the materials on the wafer.

A primary electron beam 120 may be emitted from cathode 118 by applying a voltage between anode 116 and cathode 118. Primary electron beam 120 passes through gun aperture 114 and beam limit aperture 112, both of which may determine the current of electron beam entering condenser lens 110, which resides below beam limit aperture 112. Condenser lens 110 may focus primary electron beam 120 before the beam enters objective aperture 108 to set the current of the electron beam before entering compound objective lens 104.

Compound objective lens 104 may focus primary electron beam 120 onto wafer 103 for inspection and may form a probe spot 122 on surface of wafer 103. Deflector 104c deflect primary electron beam 120 to scan probe spot 122 over wafer 103. For example, in a scanning process, deflector 104c may be controlled to deflect primary electron beam 120 sequentially onto different locations of top surface of wafer 103 at different time points, to provide data for image reconstruction for different parts of wafer 103. Moreover, deflector 104c may also be controlled to deflect primary electron beam 120 onto different sides of wafer 103 at a particular location, at different tie points, to provide data for stereo image reconstruction of the wafer structure at that location. Further, in some embodiments, anode 116 and cathode 118 may be configured to generate multiple primary electron beams 120, and electron beam tool 100A may include a plurality of deflectors 104c to project the multiple primary electron beams 120 to different parts or sides of wafer 103 at the same time.

When a current is applied onto exciting coil 104d, an axially-symmetric (i.e., symmetric around optical axis 170) magnetic field may be generated in a region of the wafer surface. A part of wafer 103 being scanned by primary electron beam 120 may be immersed in the magnetic field. Different voltages may be applied onto wafer 103, pole piece 104a, and control electrode 104b, to generate an axial symmetric retarding electric field near the wafer surface. The electric field may reduce the energy of impinging primary electron beam 120 near the surface of the wafer before it collides with wafer 103. Control electrode 104b, being electrically isolated from pole piece 104a, may control an axially-symmetric electric field on the wafer to prevent micro-arcing of the wafer and to ensure proper beam focus at the wafer surface with the axially-symmetric magnetic field together.

A secondary electron beam 130 may be emitted from the part of wafer 103 upon receiving primary electron beam 120. Secondary electron beam 130 may be received by sensor surfaces of electron detector 106. Electron detector 106 may generate a signal (e.g., a voltage, a current, etc.) that represents an intensity of secondary electron beam 130, and provide the signal to controller 109 that may be in communication with electron detector 106. The intensity of secondary electron beam 130 may vary according to the external or internal structure of wafer 103. Moreover, as discussed above, primary electron beam 120 may be projected onto different locations of the top surface of wafer 103, or different sides of wafer 103 at a particular location, to generate secondary electron beams 130 of different intensities. By mapping the intensity of secondary electron beam 130 with the locations of wafer 103, controller 109 may reconstruct an image that reflects internal or external structures of wafer 103.

Moreover, although FIG. 2A shows an example of electron beam tool 100A that may use a single primary electron beam, EBI system 10 may include electron beam tool 100 that may also be a multi-beam inspection tool that uses multiple primary electron beams. The present application does not limit the number of primary electron beams used in electron beam tool 100.

Figure 2B:
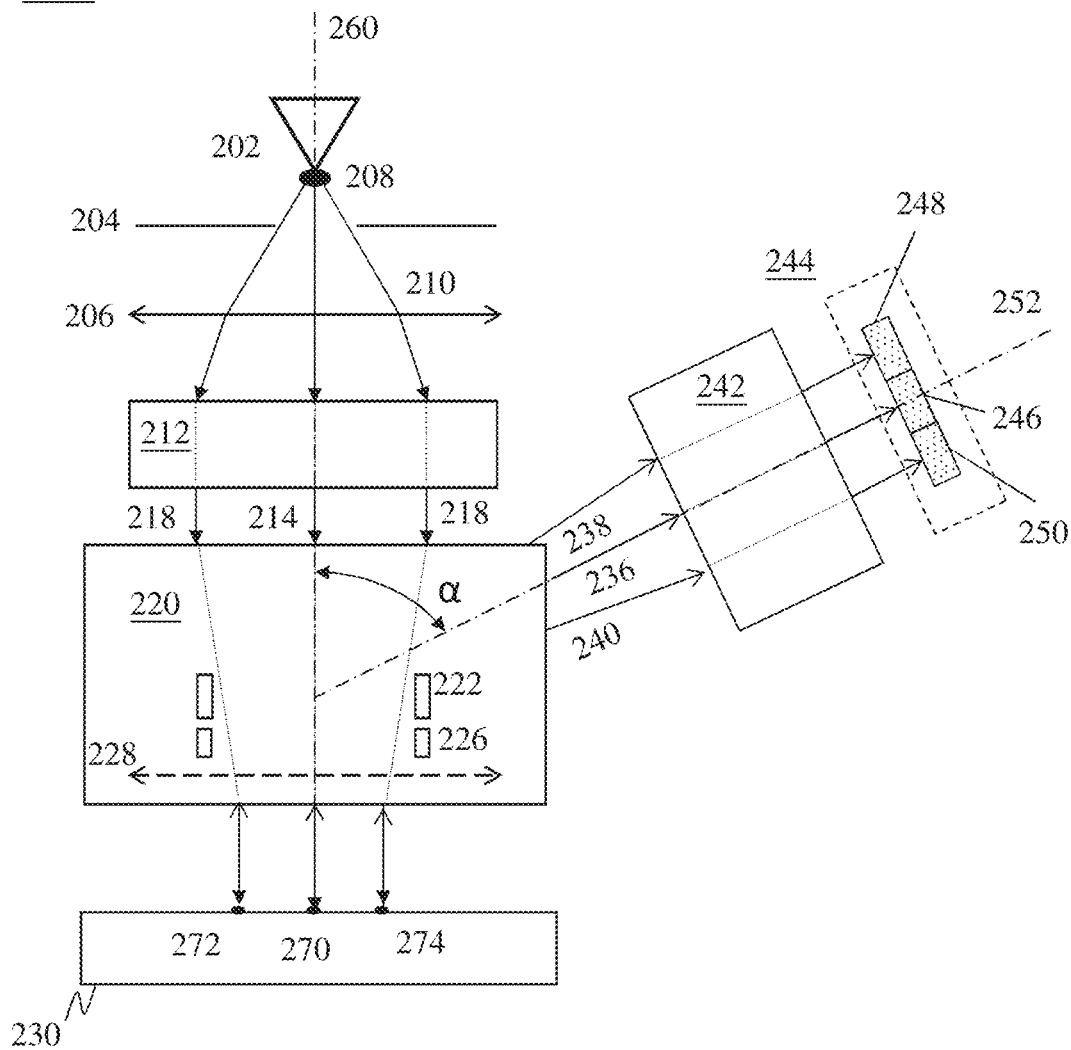

For example, as shown in FIG. 2B, an electron beam tool 100B (also referred to herein as apparatus 100A) may be provided that comprises an electron source 202, a gun aperture 204, a condenser lens 206, a primary electron beam 210 emitted from electron source 202, a source conversion unit 212, a plurality of beamlets 214, 216, and 218 of primary electron beam 210, a primary projection optical system 220, a wafer stage (not shown in FIG. 2B), multiple secondary electron beams 236, 238, and 240, a secondary optical system 242, and an electron detection device 244. A controller, image processing system, and the like may be coupled to electron detection device 244. Primary projection optical system 220 may comprise a beam separator 222, deflection scanning unit 226, and objective lens 228. Electron detection device 244 may comprise detection sub-regions 246, 248, and 250.

Electron source 202, gun aperture 204, condenser lens 206, source conversion unit 212, beam separator 222, deflection scanning unit 226, and objective lens 228 may be aligned with a primary optical axis 260 of apparatus 100A. Secondary optical system 242 and electron detection device 244 may be aligned with a secondary optical axis 252 of apparatus 100A.

Electron source 202 may comprise a cathode, an extractor or an anode, wherein primary electrons can be emitted from the cathode and extracted or accelerated to form a primary electron beam 210 with a crossover (virtual or real) 208. Primary electron beam 210 can be visualized as being emitted from crossover 208. Gun aperture 204 may block off peripheral electrons of primary electron beam 210 to reduce size of probe spots 270, 272, and 274.

Source conversion unit 212 may comprise an array of image-forming elements (not shown in FIG. 2B) and an array of beam-limit apertures (not shown in FIG. 2B). An example of source conversion unit 212 may be found in U.S. Pat. No. 9,691,586; U.S. Publication No. 2017/0025243; and International Application No. PCT/EP2017/084429, all of which are incorporated by reference in their entireties. The array of image-forming elements may comprise an array of micro-deflectors or micro-lenses. The array of image-forming elements may form a plurality of parallel images (virtual or real) of crossover 208 with a plurality of beamlets 214, 216, and 218 of primary electron beam 210. The array of beam-limit apertures may limit the plurality of beamlets 214, 216, and 218.

Condenser lens 206 may focus primary electron beam 210. The electric currents of beamlets 214, 216, and 218 downstream of source conversion unit 212 may be varied by adjusting the focusing power of condenser lens 206 or by changing the radial sizes of the corresponding beam-limit apertures within the array of beam-limit apertures. Condenser lens 206 may be a moveable condenser lens that may be configured so that the position of its first principle plane is movable. The movable condenser lens may be configured to be magnetic, which may result in off-axis beamlets 216 and 218 landing on the beamlet-limit apertures with rotation angles. The rotation angles change with the focusing power and the position of the first principal plane of the movable condenser lens. In some embodiments, the moveable condenser lens may be a moveable anti-rotation condenser lens, which involves an anti-rotation lens with a movable first principal plane. Moveable condenser lens is further described in U.S. Publication No. 2017/0025241, which is incorporated by reference in its entirety.

Objective lens 228 may focus beamlets 214, 216, and 218 onto a wafer 230 for inspection and may form a plurality of probe spots 270, 272, and 274 on the surface of wafer 230.

Beam separator 222 may be a beam separator of Wien filter type generating an electrostatic dipole field and a magnetic dipole field. In some embodiments, if they are applied, the force exerted by electrostatic dipole field on an electron of beamlets 214, 216, and 218 may be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 may also be non-zero. Beam separator 222 may separate secondary electron beams 236, 238, and 240 from beamlets 214, 216, and 218 and direct secondary electron beams 236, 238, and 240 towards secondary optical system 242.

Deflection scanning unit 226 may deflect beamlets 214, 216, and 218 to scan probe spots 270, 272, and 274 over a surface area of wafer 230. Secondary electron beams 236, 238, and 240 may comprise electrons with a distribution of energies including secondary electrons and backscattered electrons. Secondary optical system 242 may focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals used to reconstruct an image of surface area of wafer 230.

Figure 3:
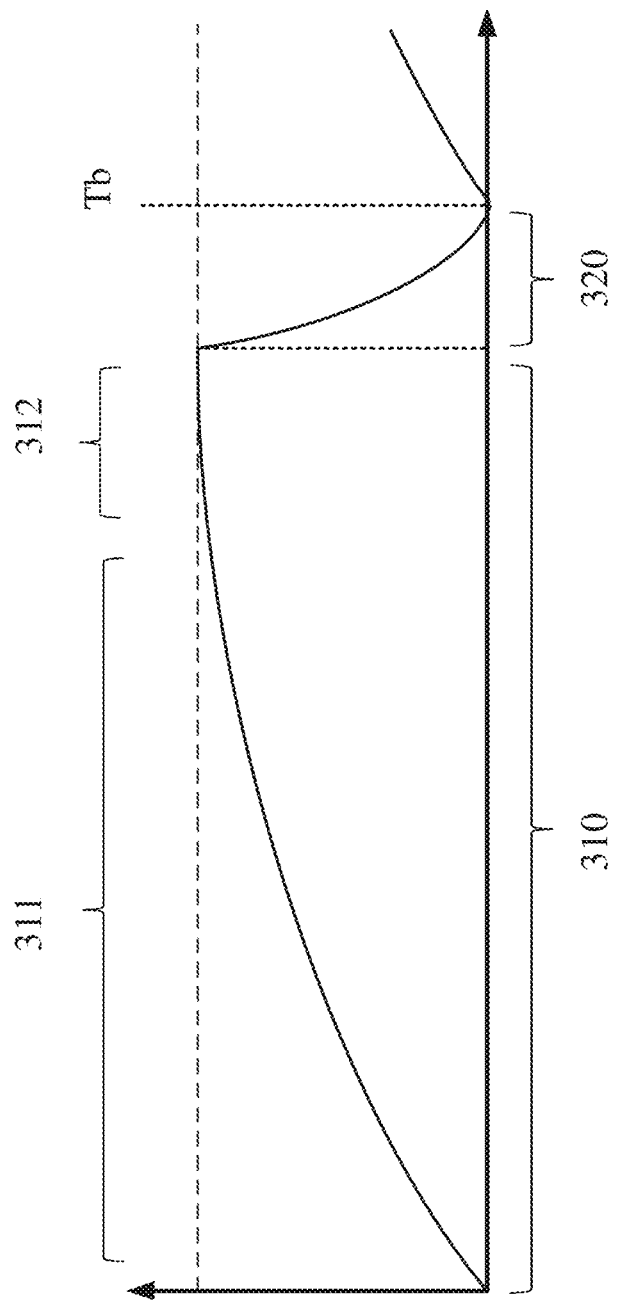
FIG. 3 illustrates exemplary temporal characteristics of charging and inspection, consistent with embodiments of the present disclosure.

Reference is now made to FIG. 3, which illustrates exemplary temporal characteristics of charging and inspection. The abscissa of the graph of FIG. 3 represents time. The ordinate of the graph of FIG. 3 represents an amount of charge on a wafer surface in arbitrary units. In some embodiments, wafer pre-conditioning may be performed prior to conducting inspection, defect review, or other types of imaging, for example. Pre-conditioning may include pre-charging a wafer surface. Pre-charging may be useful to enhance voltage contrast type defect signals, for example as discussed in U.S. Pat. Nos. 8,748,815 and 8,759,762, both of which are herein incorporated by reference in their entirety.

As shown in FIG. 3, in a charging period 310, a wafer surface may accumulate a charge. Charging period 310 may include a transient period 311 and a steady state period 312. In transient period 311, charge may build up relatively quickly; and in steady state period 312, a rate of charging may decrease and charging may approach a maximum. Charging period 310 may be described by a time constant. Charging period 310 may correspond to application of a pre-charging beam to a wafer.

In an inspection period 320, charge may dissipate. Inspection period 320 may correspond to a time in which a pre-charging beam is no longer applied to a wafer. In some embodiments, charge may dissipate from a wafer surface quickly, leaving little time to perform inspection. For example, after applying a pre-charging beam to a sample, time may elapse while equipment is switched from a pre-charging beam to an inspection beam, and a time Tb may be reached where surface charge of the sample diminishes to zero or nearly zero before inspection can be completed, resulting in certain defects not being detected, such as during a voltage contrast inspection. Therefore, pre-charging may need to be performed again.

Additionally, in some applications, detection performance may be limited by the time that it takes to switch between pre-charging and imaging, also referred to as the switching time. If charge dissipates before an inspection beam can be brought into engagement with the sample, due to the switching time, then no amount of pre-charging may be effective in enabling certain defects to be detected.

Some applications may require a predetermined amount of charge to remain on a wafer before conducting inspection. In some embodiments, charging decay may be a significant parameter for imaging. Particularly, some applications may use samples that have very high rates of charge decay, and therefore, may require very fast or very frequent switching between pre-charging and imaging modes.

Figure 4:
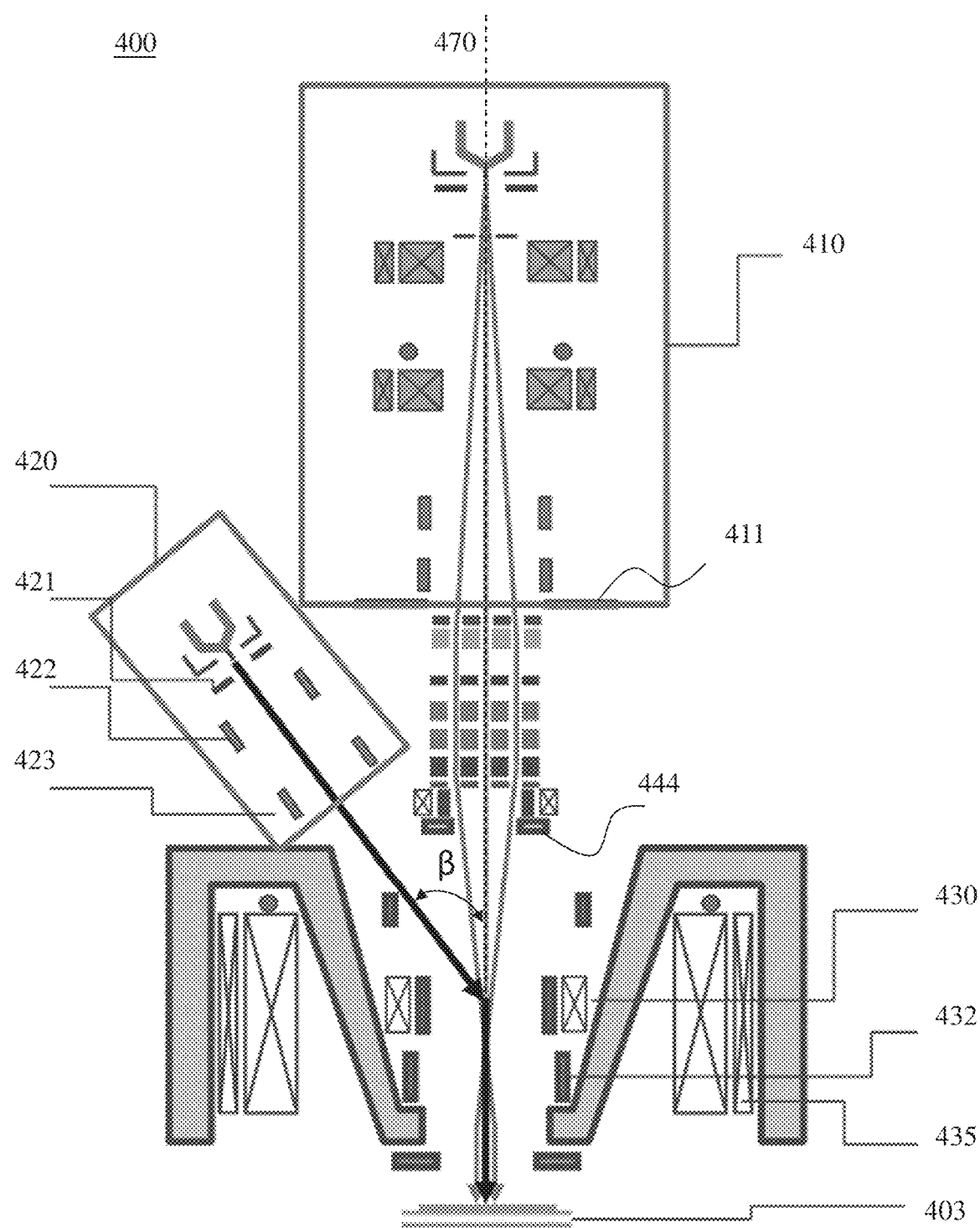
FIG. 4 illustrate exemplary electron beam tools that may be part of the electron beam inspection system of FIG. 1, consistent with embodiments of the present disclosure.

Reference is now made to FIG. 4, which illustrates an exemplary electron beam tool 400 that may also be part of the EBI system of FIG. 1. Electron beam tool 400 (also referred to herein as "apparatus 400") may be similar to apparatus 100A or 100B. Electron beam tool 400 includes a primary electron beam source 410 that may be used for imaging, such as defect inspection. Primary electron beam source 410 may include a cathode, an anode, and an aperture, among other things. Primary electron beam source 410 may also include lenses. Primary electron beam source 410 may be configured to emit electrons along a primary optical axis 470 to be projected on wafer 403.

Apparatus 400 may also be provided with a second electron beam source 420. Second electron beam source 420 may be a separate component that is separated and physically spaced apart from primary electron beam source 410. Second electron beam source 420 may include components similar to primary electron beam source and may be configured to emit electrons along a second optical axis. The second optical axis may form an angle β with primary optical axis 470. Second electron beam source 420 may be mounted so that a certain angle is formed with respect to the primary column of apparatus 400. In some embodiments, angle β may be less than or equal to 30 degrees. Angle β may be determined based on packaging constraints. In some embodiments, angle β may be within 10-20 degrees. Second electron beam source 420 may be used for pre-conditioning, such as pre-charging of wafer 403.

Second electron beam source 420 may include a gun aperture 421, lens 422, and blanker 423. Lens 422 may be an electrostatic lens. Lens 422 may be used to control a spot size of an electron beam generated by second electron beam source 420. In some embodiments, lens 422 may be a magnetic lens. Blanker 423 may be configured to switch a beam generated from second electron beam source 420 from an on state to an off state.

In some embodiments, a charged particle beam system may include a first charged particle beam source configured to provide first charged particles to image a sample at a first time. For example, apparatus 400 may include primary electron beam source 410 that may be configured to provide primary electrons that may be used to image wafer 403. The charged particle beam system may also include a second charged particle beam source configured to provide second charged particles to precondition the sample at a second time. For example, apparatus 400 may include second electron beam source 420 that may be configured to provide flooding electrons to wafer 403. The charged particle beam system may further include a component configured to generate an electrostatic or magnetic field to influence the first charged particles to impact the sample at the first time and to influence the second charged particles to impact the sample at the second time.

Apparatus 400 may comprise a lower column including an alignment deflector 430, a scanning deflector 432, and an objective lens 435, all or some of which may be aligned with primary optical axis 470. Alignment deflector 430 may include a component that is configured to generate an electrostatic field or a magnetic field. The component may generate both an electrostatic field and a magnetic field, and may be used as a velocity filter for charged particles. Alignment deflector 430 may include a magnetic lens. Alignment deflector 430 may include an electrostatic lens. In some embodiments, alignment deflector 430 may include a Wien filter. Alignment deflector 430 may be used as a beam separator to separate charged particles having different velocity from one another. Alignment deflector 430 may influence charged particles travelling through it. In some embodiments, influence of alignment deflector 430 may include enabling electrons to travel straight through alignment deflector 430. For example, alignment deflector 430 may be configured such that electrons traveling from primary electron beam source 410 along primary optical axis 470 toward wafer 403 are allowed to travel straight through alignment deflector 430 while secondary or backscattered electrons traveling back from wafer 403 are deflected. In the example of FIG. 2B, beam separator 222 may be configured to influence secondary beams by diverting them by an angle α toward electron detection device 244.

Returning to FIG. 4, apparatus 400 may also include objective lens 435. Second electron beam source 420 may be configured as an in-lens system. For example, there may be only one objective lens provided for both primary electron beam source 410 and second electron beam source 420. Second electron beam source 420 may bypass a column aperture 411 that may be provided for primary electron beam source 410. Therefore, control of imaging conditions of second electron beam source 420 may be performed separate from primary electron beam source 410. Imaging conditions used for primary electron beam source 410, which may be relatively sensitive, may be left as-is while conditions for second electron beam source 420 may be manipulated without affecting primary electron beam source 410. For example, levels of beam current and focus may be adjusted independently.

Second electron beam source 420 may be shielded from primary electron beam source 410. For example, electromagnetic shielding may be provided around some or all components contained in second electron beam source 420. In some embodiments, lens 422 of second electron beam source 420 may be provided as an electrostatic lens. An electrostatic lens may reduce interference with primary electron beam source 410 as compared to, for example, a magnetic lens. In some embodiments, an electromagnetic shield tube may be provided around some or all components of second electron beam source 420, or around a beam so as to shield the beam from electromagnetic interference.

Gun aperture 421 of second electron beam source 420 may include an adjustable aperture. An adjustable aperture may be a movable aperture including a plurality of aperture holes that may be used to choose different beam current for flooding wafer 403. Blanker 423 may be used to blank the beam of second electron beam source 420 at certain times, for example diverting the beam of second electron beam source 420 away from wafer 403 during the time that image scanning is conducted by primary electron beam source 410.

In operation, apparatus 400 may be controlled in two states, for example, as follows. A first state may include pre-charging and a second state may include imaging. In the first state, primary electron beam source 410 may be used to generate a primary electron beam along primary optical axis 470. The primary electron beam may be blanked. For example, a deflector may be provided that is controlled to cause the primary electron beam to divert from a trajectory parallel to primary optical axis 470. Thus, the primary electron beam may be diverted away from a sample, such as wafer 403. While the beam from primary electron beam source 410 is being blanked, second electron beam source 420 may generate an electron beam. The beam generated by second electron beam source 420 may be used for pre-charging of wafer 403. During pre-charging, alignment deflector 430 may be set to a first operating state. Alignment deflector 430 may be configured so that in the first operating state the beam generated by second electron beam source 420 is directed to wafer 403. For example, alignment deflector 430 may be set with a first predetermined setting of voltage and current.

In the second state, after pre-charging, the beam generated by second electron beam source 420 may be blanked away, and the primary beam generated by primary electron beam source 410 may begin to scan a point of interest (POI) on the surface of wafer 403. During the second state, alignment deflector 430 may be set to a second operating state. Alignment deflector 430 may be configured so that in the second operating state the beam generated by primary electron beam source 410 is directed to wafer 403. For example, alignment deflector 430 may be set with a second predetermined setting of voltage and current.

Settings of components in primary electron beam source 410 may be maintained in both the first state and second state. For example, a condenser lens may be operated with the same operating conditions in the first state and the second state. Furthermore, other components may also maintain their settings. For example, objective lens 435 may be operated with the same operating conditions in the first state and the second state. Objective lens 435 may be configured to focus the beam generated from primary electron beam source 410 to be form a probe spot on wafer 403 in the second state.

In the first state, as discussed above, an electron beam tool may be configured to operate in a charging period 310, as discussed above with reference to FIG. 3. Meanwhile, in the second state, the electron beam tool may be configured to operate in an inspection period 320, as discussed above with reference to FIG. 3.

In some embodiments, components of an EBI system 10 may be configured to switch between a first state and a second state. For example, controller 109 may be configured to switch operation states. Controller 109 may send instructions to various components of a charged particle beam system, such as systems including electron beam tool 100A, electron beam tool 100B, or electron beam tool 400. A beam separator, alignment deflector, or Wein filter may be configured to switch between a first operating state and a second operating state. For example, alignment deflector 430 may be configured to change an operating voltage from a first voltage to a second voltage. The first voltage may be used in the first operating state and may be greater than the second voltage that may be used in the second operating state. Switching between the first state and the second state may be accomplished by changing the operating voltage of alignment deflector 430 and changing a status of blankers of primary electron beam source 410 and second electron beam source 420, thereby toggling which of the beams generated by primary electron beam source 410 and second electron beam source 420 is directed to wafer 403.

Switching between a first state and a second state may consist of changing only a voltage of alignment deflector 430. Current level applied to alignment deflector 430 may remain constant between the first state and the second state. While alignment deflector 430 may be configured to generate both electrostatic and magnetic field, switching between the first state and the second state may require only changing the voltage applied to alignment deflector 430, thus changing only the electrostatic portion of fields generated by alignment deflector 430. Meanwhile, the magnetic field generated by alignment deflector 430 may remain constant between the first state and the second state. In some embodiments, altering a magnetic field may involve hysteresis effects and may require relatively long-time periods before fields stabilize. However, in some embodiments of the disclosure, switching between a first state and a second state may be accomplished by changing only an electrostatic field. Changing an electrostatic field may be done quickly and without hysteresis. Therefore, extraneous effects on beams passing through alignment deflector 430 may be minimized.

For example, in some embodiments, changing a voltage applied to alignment deflector 430 between values of 200 V and 800 V may take 0.1 to 0.2 ms of changing time. Comparatively, it may take several seconds to adjust a magnetic field generated by a magnetic lens.

In some embodiments, angle β may be set to be minimized in consideration of various criteria. For example, the lower angle β is, the less voltage difference required in switching operating state of alignment deflector 430. The lower difference in voltage between operating states may correspond to a lower speed required for switching. Furthermore, a higher angle may require a higher voltage, which may cause increased manufacturing constraints on components of a charged particle beam system. For example, using components designed for a higher voltage may entail manufacturing and design complexities. In some embodiments, angle β may be set so that only an electrostatic component of alignment deflector 430 is needed to be adjusted to divert a beam generated from second electron beam source 420 to reach wafer 403.

Moreover, during the first state, in the case that pre-charging is being performed, signal detection may not be ignored. A beam generated from second electron beam source 420 may be applied to wafer 403 to conduct pre-charging, but during pre-charging, there may be no need to measure signals. Therefore, even if a large number of electrons may be generated from interactions with the surface of wafer 403 with a beam generated form second electron beam source 420, collection of secondary or back-scattered electrons may not be a concern. Thus, electrons traveling from wafer 403 may be directed toward other areas of apparatus 400. There may be no need to direct secondary electrons from wafer 403 in the first state to a detector 444. On the contrary, because a large number of electrons may be incident on wafer 403, it may be beneficial that secondary or backscattered electrons are diverted and prevented from reaching detector 444 so as to prevent contamination of detector 444.

When alignment deflector 430 is configured to divert the beam generated from second electron beam source 420 to reach wafer 403, electrostatic and magnetic fields generated from alignment deflector 430 may be unbalanced. Therefore, electrons generated from interactions of the primary electron beam with the surface of wafer 403 may be caused to travel in directions away from detector 444 when passing again through alignment deflector 430. Thus, when alignment deflector 430 is configured to divert the beam generated from second electron beam source 420 to reach wafer 403, it may also be ensured that other electrons are impeded from reaching detector 444.

For example, a base setting of alignment deflector 430 may be that electrostatic and magnetic fields are balanced so that an electron beam generated from primary electron beam source 410 is allowed to travel straight through alignment deflector 430 without having its trajectory be substantially changed. Upon interacting with the surface of wafer 403, secondary charged particles, such as secondary or backscattered electrons, may be directed back towards primary electron beam source 410 in an opposite direction. In some embodiments, secondary charged particles may be directed toward an on-axis detector, such as detector 444, as shown in FIG. 4. In other embodiments, secondary charged particles may be directed towards an off-axis detector, such as electron detection device 244, as shown in FIG. 2B. Alignment deflector may be configured so that in the second state, secondary charged particles are directed towards the detector, while in the first state, secondary charged particles are directed to locations other than the detector.

In some embodiments, the need to conduct pre-charging using primary electron beam source 410 may be avoided. Therefore, contamination of column aperture 411 may be reduced. For example, in some embodiments, when primary electron beam source 410 is configured to generate a relatively broad beam, some portions of the beam may be incident on a top surface of column aperture 411. A primary electron beam may be high in current, and thus, may cause high heat and high contamination on column aperture 411, particularly when a primary electron beam is configured to conduct flooding.

Second electron beam source 420 may have different design requirements as compared to primary electron beam source 410. For example, because second electron beam source 420 may be used only for pre-charging, and not for detailed inspection, design criteria for second electron beam source 420 may include merely ensuring a predetermined number of electrons reach a sample. Parameters such as beam shape and size may not be particularly relevant. In some embodiments, a rough beam shape of several micrometers in diameter may be suitable for use as a pre-charging beam. Thus, selection of components used in second electron beam source 420 may not necessarily be rigorous, compared to primary electron beam source 410, and second electron beam source 420 may be provided inexpensively and with greater design flexibility. Furthermore, in some embodiments, a scanning deflector may be omitted from second electron beam source 420 because there may be no need for a pre-charging beam to scan across a sample.

In some embodiments, time required for switching between pre-charging and imaging modes may be substantially reduced. For example, the switching time may be reduced to the order of nanoseconds. Switching between a first state and a second state may be accomplished merely by adjusting a voltage applied to an alignment deflector, such as a Wein filter. The time of imaging duty cycle and pre-charging may be optimized according to applications with greater flexibility.

The embodiments may further be described using the following clauses:

1. A charged particle beam system comprising:
    a first charged particle beam source provided on a first axis;
    a second charged particle beam source; and
    a component arranged on the first axis, the component configured to deflect a beam generated from the second charged particle beam source towards a sample.

2. The charged particle beam system of clause 1, wherein the component is configured to generate a magnetic field or an electric field.
3. The charged particle beam system of clause 2, wherein the component that is configured to generate the magnetic field or the electric field includes a deflector that is configured to generate the magnetic field and the electric field.
4. The charged particle beam system of any of the preceding clauses, wherein the component is arranged in a region of an objective lens.
5. The charged particle beam system of clause 4, wherein only one objective lens is provided in the charged particle beam system.
6. The charged particle system of any of the preceding clauses, further comprising a driver configured to supply an adjustable voltage to the component.
7. The charged particle beam system of any of the preceding clauses, wherein the charged particle beam system is configured to switch between a first state and a second state, wherein in the second state, a first charged particle beam generated from the first charged particle beam source is directed towards the sample, and in the first state, a second charged particle beam generated from the second charged is directed towards the sample.
8. The charged particle beam system of clause 7, wherein the component is configured to switch between the first state and the second state.
9. The charged particle beam system of clause 8, further comprising a controller configured to switch the component between the first state and the second state.
10. The charged particle beam system of any of the preceding clauses, wherein an angle between a second axis on which the second charged particle beam source is provided and the first axis is less than 30 degrees.
11. The charged particle beam system of clause 10, wherein the angle is 10 to 20 degrees.
12. The charged particle beam system of any of the preceding clauses, further comprising an electrostatic lens provided in the second charged particle beam source configured to focus a beam generated therefrom.
13. A method of operating a charged particle beam system, the method comprising:
    switching between a first state and a second state of operating a component, the component being configured to generate a magnetic field and an electric field,
    wherein in the first state, a first charged particle beam generated from a first charged particle beam source is blanked, and a second charged particle beam generated from a second charged particle beam source is directed toward a sample, and
    in the second state, the second charged particle beam is blanked and the first charged particle beam is directed toward the sample.
14. The method of clause 13, further comprising:
    supplying a first voltage to the component in the first state; and
    supplying a second voltage to the component in the second state.
15. The method of clause 14, wherein the first voltage is less than the second voltage.
16. A charged particle beam system comprising:
    a first charged particle beam source configured to provide first charged particles to image a sample at a first time;

a second charged particle beam source configured to provide second charged particles to precondition the sample at a second time; and
a component configured to generate an electrostatic or magnetic field to influence the first charged particles to impact the sample at the first time and to influence the second charged particles to impact the sample at the second time.

17. The charged particle beam system of clause 16, wherein the component is a magnetic lens.
18. The charged particle beam system of clause 16, wherein the component is a deflector.
19. The charged particle beam system of clause 16, wherein the component is an electrostatic lens.
20. The charged particle beam system of clause 16, wherein the component is a Wien filter.
21. The charged particle beam system of clause 16, wherein the component being configured to generate the electrostatic or the magnetic field includes the component being configured to generate the electrostatic and the magnetic field.
22. The charged particle beam system of any one of clauses 16-21, wherein the component is arranged in a region of an objective lens.
23. The charged particle beam system of clause 22, wherein only one objective lens is provided in the charged particle beam system.
24. The charged particle beam system of any one of clauses 16-23, further comprising a driver configured to supply an adjustable voltage to the component.
25. The charged particle beam system of any one of clauses 16-24, wherein the charged particle beam system is configured to switch between a first state and a second state, wherein in the second state, the first charged particles are directed towards the sample, and in the first state, the second charged particles are directed towards the sample.
26. The charged particle beam system of clause 25, wherein the component is configured to switch between the first state and the second state.
27. The charged particle beam system of clause 26, further comprising a controller configured to switch the component between the first state and the second state.
28. The charged particle beam system of any one of clauses 16-27, wherein an angle between a first axis on which the first charged particle beam source is provided and a second axis on which the second charged particle beam source is provided is less than 30 degrees.
29. The charged particle beam system of clause 28, wherein the angle is 10 to 20 degrees.
30. The charged particle beam system of any one of clauses 16-29, further comprising an electrostatic lens provided in the second charged particle beam source configured to focus a beam generated therefrom.

Aspects of the present disclosure may be advantageously applied in application such as 3D NAND and DRAM, for example, where decay time may be a critical parameter and thus shorting of switching time between pre-charging and imaging may yield numerous benefits. Furthermore, aspects of the present disclosure may be especially applicable to certain types of defect inspection, such as voltage contract defects including, e.g., shorted gates, floating gates, and open interconnects.

In some embodiments, a controller may be provided to control a charged particle beam system. For example, FIG. 1 illustrates controller 109 connected to EBI system 10. The controller may instruct components of the charged particle beam system to perform various functions, such as controlling a charged particle beam source to generate a charged particle beam, controlling a deflector to scan the charged particle beam across a sample, controlling switching between a first state and a second state, and controlling drivers to apply voltages or other signals to lenses or other components, such as an alignment deflector. The controller may also perform various post-processing functions, image acquisition, image subdivision, image processing, generating contours, superimposing indicators on an acquired image, and the like. The controller may comprise a storage that is a storage medium such as a hard disk, cloud storage, random access memory (RAM), other types of computer readable memory, and the like. The storage may be used for saving scanned raw image data as original images, or for saving post-processed images. The controller may communicate with a cloud storage. A non-transitory computer readable medium may be provided that stores instructions for a processor of controller 109 to carry out beam forming, lens control, or other functions and methods consistent with the present disclosure. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

Although the present invention has been explained in relation to some exemplary embodiments, it is to be understood that other modifications and variation may be made without departing the spirit and scope of the invention as hereafter claimed. For example, although a compound lens has been discussed with reference to application as a first zoom lens, a compound lens may be applied as a second zoom lens, or other lenses in a particle-optical system. Furthermore, one or more lenses or other optical components may be added at various points to the particular constructions of exemplary particle-optical system discussed herein. Optical components may be provided for, e.g., magnifying, zooming, and image anti-rotating etc.

The invention claimed is:

1. A charged particle beam system comprising:
   a first charged particle beam source configured to provide first charged particles to image a sample at a first time;
   a second charged particle beam source configured to provide second charged particles to precondition the sample at a second time; and
   a component positioned within an objective lens, the component configured to generate an electrostatic or magnetic field to influence the first charged particles to impact the sample at the first time and to influence the second charged particles to impact the sample at the second time,
   wherein the charged particle beam system is configured to switch between a first state and a second state and in both the first state and the second state, operating conditions of a condenser lens of the first charged particle beam source and the objective lens of the charged particle beam system are maintained.

2. The charged particle beam system of claim 1, wherein the component is a magnetic lens.

3. The charged particle beam system of claim 1, wherein the component is a deflector.

4. The charged particle beam system of claim 1, wherein the component is an electrostatic lens.

5. The charged particle beam system of claim 1, wherein the component is a Wien filter.

6. The charged particle beam system of claim 1, wherein the component being configured to generate the electrostatic or the magnetic field includes a deflector being configured to generate the electrostatic and the magnetic field.

7. The charged particle beam system of claim 1, wherein only one objective lens is provided in the charged particle beam system.

8. The charged particle beam system of claim 1, further comprising a driver configured to supply an adjustable voltage to the component.

9. The charged particle beam system of claim 1, wherein in the second state, the first charged particles are directed towards the sample, and in the first state, the second charged particles are directed towards the sample.

10. The charged particle beam system of claim 1, wherein the component is configured to switch between the first state and the second state.

11. The charged particle beam system of claim 10, further comprising a controller configured to switch the component between the first state and the second state.

12. The charged particle beam system of claim 1, wherein an angle between a first axis on which the first charged particle beam source is provided and a second axis on which the second charged particle beam source is provided is less than 30 degrees.

13. The charged particle beam system of claim 12, wherein the angle is 10 to 20 degrees.

14. The charged particle beam system of claim 1, further comprising an electrostatic lens provided in the second charged particle beam source configured to focus a beam generated therefrom.

15. The charged particle beam system of claim 1, wherein the first charged particle beam source is configured to generate a plurality of primary charged particle beamlets.

16. The charged particle beam system of claim 1, wherein when in the second state, a first plurality of charged particle beamlets is directed toward the sample.

* * * * *